(12) United States Patent
Weng et al.

(10) Patent No.: US 6,519,164 B1
(45) Date of Patent: Feb. 11, 2003

(54) SINGLE POWER STAGE AC/DC FORWARD CONVERTER WITH POWER SWITCH VOLTAGE CLAMPING FUNCTION

(75) Inventors: DaFeng Weng, San Jose, CA (US); Jinrong Qian, Croton-on-Hudson, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/883,432

(22) Filed: Jun. 18, 2001

(51) Int. Cl.[7] .................... H02M 3/335; H02H 7/125
(52) U.S. Cl. .................... 363/21.04; 363/21.08; 363/56.03; 363/17
(58) Field of Search ............ 363/21.04, 21.08, 363/21.09, 17, 56.03, 131

(56) References Cited

U.S. PATENT DOCUMENTS

| 5,548,503 | A | | 8/1996 | Motonobu et al. |
| 5,982,638 | A | | 11/1999 | Tang et al. |
| 6,166,924 | A | * | 12/2000 | Assow .................... 363/20 |
| 6,195,270 | B1 | * | 2/2001 | Wittenberder ............ 363/17 |
| 6,295,213 | B1 | * | 9/2001 | Smith .................... 363/21.01 |
| 6,314,002 | B1 | * | 11/2001 | Qian et al. ............ 363/21.04 |

* cited by examiner

Primary Examiner—Bao Q. Vu

(57) ABSTRACT

A method and circuit for clamping a voltage across a switching element in a forward converter circuit to a value equal to or less than the DC bus voltage. The disclosed circuit and method achieves voltage clamping in a circuit configuration in which two series connected direct current (DC) bus capacitors are connected in parallel with a switching element to be clamped. Clamping is further achieved by selecting capacitor values to be sufficiently large so as to maintain a constant voltage throughout each switching cycle of the switching element. The capacitors serve a second function in that they recover energy stored in the windings of an isolation transformer which would otherwise be dissipated in a conventional circuit design.

12 Claims, 7 Drawing Sheets

SINGLE POWER STAGE AC/DC FORWARD CONVERTER WITH POWER SWITCH VOLTAGE CLAMPING FUNCTION

BACKGROUND OF THE INVENTION

1. Field of the Invention

The present invention relates to a circuit configuration for use with a switched power supply of the forward converter type.

2. Description of the Related Art

"Attention has been focused on the input current total harmonic distortion (THD) due to the increased use of nonlinear loads that tend to degrade AC line quality. THD standards, such as the IEC-1000-3-2 promulgated by the international Electrochemical Commission, have been adopted. Due to requirements associated with cost effectiveness, there are numerous references in the prior art directed to single power stage AC-DC converters which employ such nonlinear loads. The power supply used with these converters usually requires multiple output DC voltages and fast output regulation. In addition, a high frequency power transformer is used to step up/down the output DC voltage. The transformer presents several drawbacks. First, a higher voltage stress occurs across the power switch due to the transformer volts-second reset. Second, the leakage inductance of the transformer, usually causes a voltage spike across the power switch when it turns off. To minimize or reduce the voltage spike, a snubber circuit, such as a R-C-D snubber, is sometimes used to absorb this voltage spike. This is not an optimum solution, however, in that the leakage energy of the transformer is dissipated in the snubber circuit making the circuit inefficient."

One prior art single power stage AC-DC forward converter is shown in FIG. 1, where $L_k$ is the leakage inductance of the transformer T, $D_s$, is the body diode and $C_{ds}$ is an internal capacitance of switch S. The inductor $L_{in}$ is a boost inductor and is used to shape the input current waveform to achieve a high power factor with low input current harmonics. Winding N3, coupled with windings N1 and N2, is used to reset the transformer T.

FIGS. 2a–2b illustrate typical switching waveforms associated with the circuit of FIG. 1. The voltage on DC bus capacitor $C_{dc}$, i.e., $V_{dc}$, is considered to be constant over successive switching cycles as a consequence of the large capacitance value selected for $C_{dc}$ in comparison with the switching period. During the time switch S is on, time (t1–t2), voltage $V_{dc}$ is applied to primary winding N1 and leakage inductor $L_k$. Therefore, the voltage $V_{dc}$ on capacitor $C_{dc}$ is discharged to the load $R_o$ via transformer coupling N1–N2. The difference between the reflected voltage across winding N2 and the voltage across the load $R_o$, i.e., $V_o$, is applied to the choke inductor $L_f$ as $V_{lf}$ for the period (t1–t2). As a result, an increased current produced in $L_f$ is delivered to the output load $R_o$. Also, during time interval (t1–t2), a circuit path is formed from the AC voltage source $V_{in}$, through inductor $L_{in}$, diode D5, switch S and back to ground. Energy is stored in inductor $L_{in}$ during this time.

Considering the time during which switch S is off, i.e., (t2–t4). Diode D5 is nonconducting. The current through $L_{in}$ therefore flows through diode D4 charging capacitor $C_{dc}$. It is noted, however, this charging current is inconsequential given the large capacitance value of $C_{dc}$ and the relatively short charging interval. A magnetizing current in winding N1, which previously traveled through switch S during the time switch S was on, is now transferred (magnetically coupled) to winding N3 causing diode D1 to transition to a conducting state. A voltage developed across winding N3 by virtue of the coupled magnetizing current ser-cs as additional charging source for capacitor $C_{dc}$. During this time interval (t2–t4), the winding current in N3 is effectively reset. A negative voltage which is developed across N2 in the secondary winding causes diode D2 to become nonconducting. As such, energy stored in $L_f$ during the time (t1–t2) is released through the load $R_o$ for the time (t2–t4).

A drawback associated with the circuit of FIG. 1 is that at time t2, the point at which switch S turns off, the energy which was stored in leakage inductor L during the time (t1–t2), i.e., the time switch S was ON, is released to charge internal switch capacitor $C_{ds}$ thereby generating an undesirable voltage spike as shown in FIG. 2b. After the leakage energy is released, the voltage across switch S is equal to the sum of the DC bus voltage plus the tranformers reset voltage. A negative consequence of the higher voltage across switch S is that a higher rated switch S is required, especially for a higher input line voltage, e.g., 277 AC. An associated drawback of using higher voltage rated switches is their increased cost.

A number of circuit topologies have been proposed in the prior art to eliminate the large overvoltages which occur across switching devices at turn off. One method for minimizing the large overvoltages is the use of an R-C-D snubber network. In general, the function of a snubber circuit is to reduce the electrical stresses placed on a device during switching by a power electronics converter to levels that are within the electrical ratings of the device. In the present case, a snubber network is employed to limit voltages applied to a switch during turn-off transients.

FIG. 3 illustrates the prior art circuit of FIG. 1 with the addition of an R-C-D snubber network. While the snubber network minimizes or reduces the occurrence of voltage spikes, it does so at the expense of reducing the conversion efficiency of the circuit. In addition, snubbers introduce additional complexity and cost to the basic converter circuit. As such, it is a non-optimal solution.

Thus, it is desirable to provide a converter design that limits the maximum voltage stress on the power switch and recycles the leakage energy of the transformer such that the circuits efficiency is enhanced.

SUMMARY OF THE INVENTION

According to the invention, a single power stage AC/DC forward converter with power switch voltage clamping function includes: a switch S; $L_{k1}$ and $L_{k2}$ representing leakage inductances associated with the primary windings of transformer T, two series clamping and recovery capacitors $C_{d1}$ and $C_{d2}$; a transformer T including primary windings N1 and N2 having the same number of turns; a boost inductor $L_{in}$; a filter $L_f$; a diode D connected in parallel with the switch S and in series with $C_{d1}$ and $C_{d2}$.

In one embodiment, the DC bus capacitors $C_{d1}$, and $C_{d2}$, are connected directly to the leakage inductors $L_{k1}$ and $L_{k2}$, respectively. In this embodiment, during intervals between conduction by switch S, the capacitors recover leakage energy from the leakage inductors $L_{k1}$, and $L_{k2}$, and during intervals of conduction by switch S, the recovered leakage energy stored in capacitors $C_{d1}$ and $C_{d2}$, is provided to the load via transformer T.

A main advantage provided by the circuit of the present invention is the prevention or substantial elimination of voltage spikes which would otherwise occur at each switch transition to the OFF state. Voltage spikes are eliminated in two ways: (1) by configuring the DC bus capacitors $C_{d1}$, and $C_{d2}$ to be in parallel with the switch S and, (2) by selecting the capacitance values of capacitors $C_{d1}$ and $C_{d2}$ to be sufficiently large to clamp the voltage across switch S to a value equal to the DC bus voltage.

A further advantage of the circuit of the present invention is that by recovering the leakage energy in each switching cycle, as opposed to dissipating it in accordance with prior art approaches, the overall circuit efficiency (i.e., power out/power in) is enhanced. An additional advantage of capturing the leakage current is that the voltage rating of switch S is significantly reduced thereby reducing its cost.

Accordingly, it is an object of the invention to provide an AC/DC forward converter in which the voltage across the main switch S is clamped to the DC bus voltage, thereby preventing the occurrence of undesirable voltage spikes.

It is another object of the invention to provide an AC/DC forward converter in which the leakage energy of the transformer is substantially recovered to improve circuit efficiency.

It is yet another object of the invention to meet the objectives stated above with a converter in which a minimum number of components are used to reduce costs.

Still other objects and advantages of the invention, will, in part, be obvious and will, in part, be apparent from the specification.

BRIEF DESCRIPTION OF THE DRAWINGS

The foregoing features of the present invention will become more readily apparent and may be understood by referring to the following detailed description of an illustrative embodiment of the present invention, taken in conjunction with the accompanying drawings, where.

DESCRIPTION OF THE PREFERRED EMBODIMENTS

An AC/DC forward converter circuit is provided which eliminates or significantly reduces voltage spikes which occur across the circuit switching element during turn-off at each switching cycle. Additionally, the converter circuit of the present invention is more power efficient than converter circuits of the prior art in that inductor leakage energy is recovered during intervals between conduction by the switching element.

Figure 1:
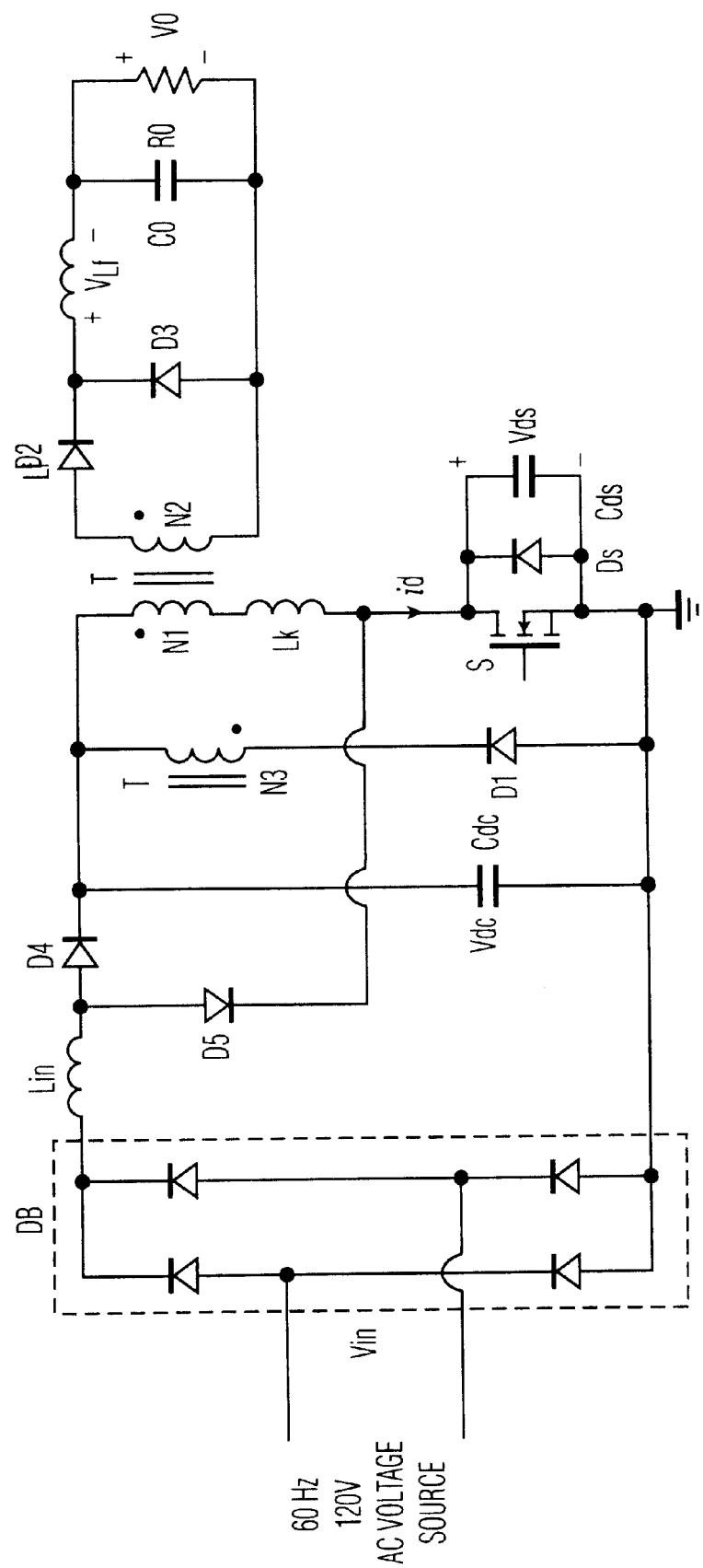
FIG. 1 is a circuit diagram illustrating an LCD backlighting converter circuit of the prior art.
Figures 2A, 2B:
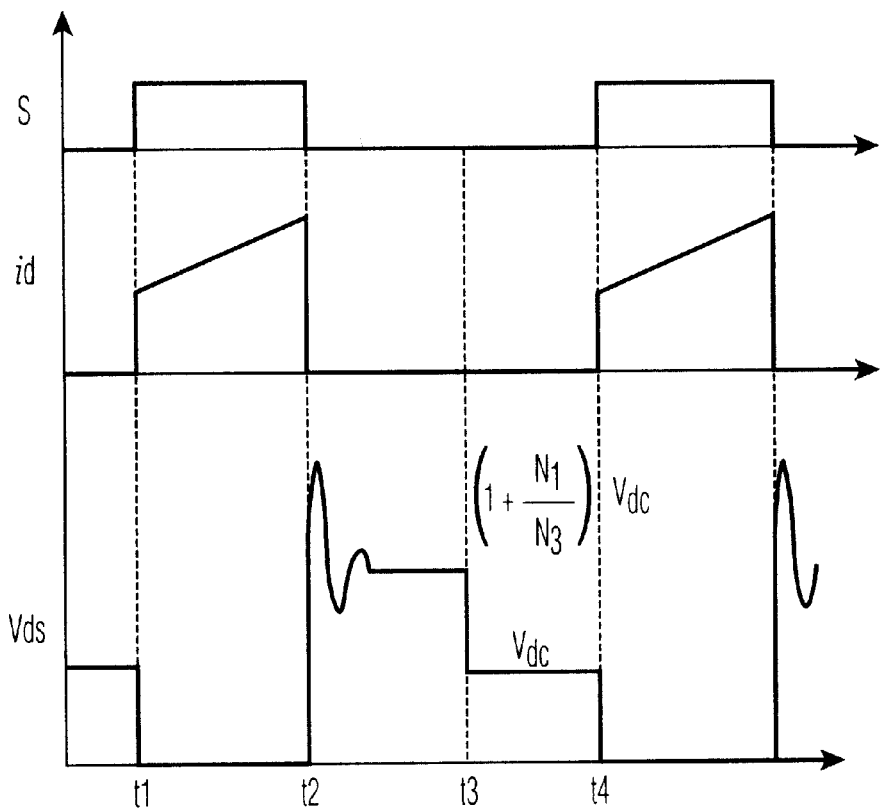
FIGS. 2a–2b illustrate representative waveforms present in the circuit of FIG. 1.
Figure 3:
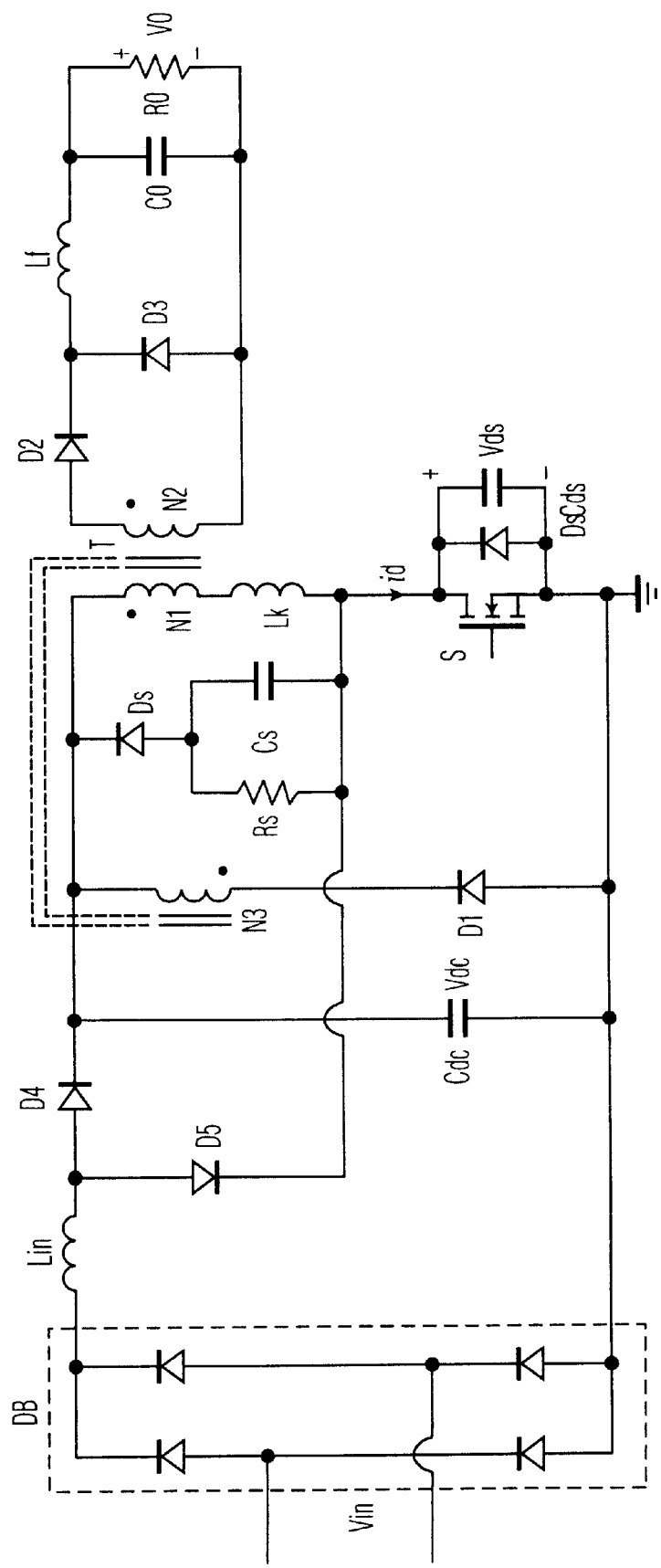
FIG.3 is a circuit diagram illustrating an LCD backlighting inverter circuit of the prior art including a R-C-D snubber network.
Figure 4:
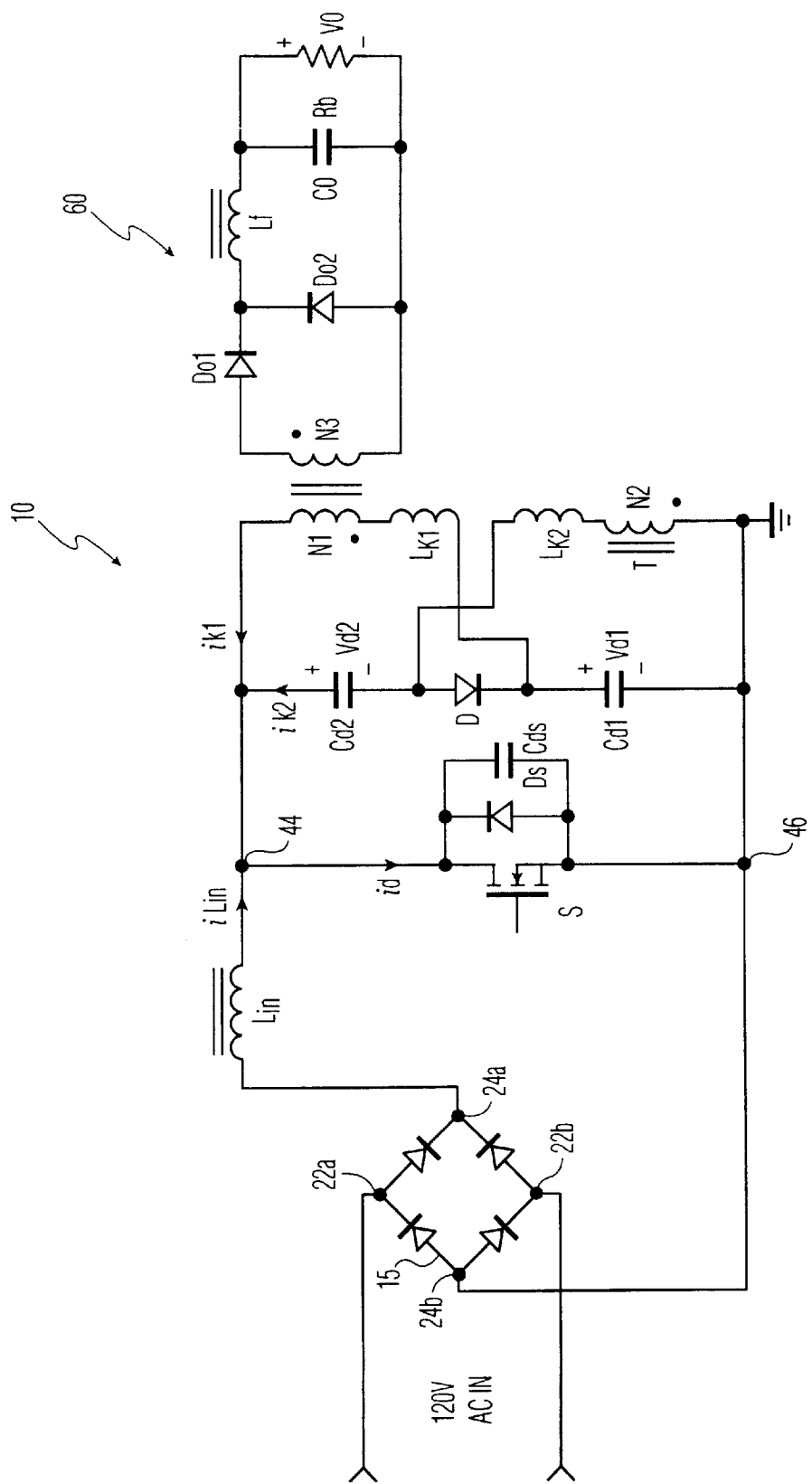
"FIG.4 is a circuit diagram illustrating an LCD backlighting inverter circuit in accordance with a first embodiment of the present invention.

"One embodiment of the AC/DC forward converter circuit 10 of the present invention is shown schematically in FIG. 4. The converter circuit 10 preferably comprises a full-wave rectifier bridge 15 having rectifier input terminals 22a, 22b and rectifier output terminals 24a, 24b. Input terminals 22a, 22b are adapted to be connected across a household-type source of AC energizing potential (90–264V AC, 60 Hz). The output of the full-wave bridge rectifier 15 is coupled to boost inductor $L_{in}$. Boost inductor $L_{in}$, is connected at junction 44 with switch S which may be a power MOSFET or other such well-known semiconductor switch as would be appreciated by those skilled in the art. Switch S includes internal body diode $D_s$, and internal junction capacitance $C_{ds}$. In parallel with switch S is DC bus capacitor $C_{d1}$, diode D and DC bus capacitor $C_{ds}$. serially connected between junctions 44 and 46. Switch S, bus capacitor $C_{d2}$ and primary winding N1 are connected together at junction 44. Transformer T includes two primary windings, N1 and N2, both of a predetermined and substantially equal inductance and a secondary winding N3. Also in series with windings N1 and N2 are shown two leakage inductors $L_{k1}$ and $L_{k2}$ associated with windings N1 and N2, respectively."

In the secondary circuit, generally indicated as reference numeral 60, the transformer secondary winding N3 is connected in series with diode $D_{O1}$, and filter $L_f$ and in parallel with diode $D_{O2}$, capacitor $C_0$, and load $R_b$. Load $R_b$ can be, but is not limited to another power supply, or another device fluorescent lamp of the cold cathode type. The light from load $R_b$ may be used to illuminate a liquid crystal display (LCD) of a computer (not shown).

The operation of circuit 10 will now be described. When switch S turns on at time t1, the rectified AC input voltage $V_{in}$ which is continuously applied to terminal 24a, is conducted through a path defined by boost inductor $L_{in}$, switch S and back to terminal 24b. It is assumed that voltages $V_{d1}$ and $V_{d2}$, associated with capacitors $C_{d1}$ and $C_{d2}$, respectively, are constant voltages as a result of the large capacitance values selected for $C_{d1}$ and $C_{d2}$. Further, capacitor $C_{d1}$ is preferably selected to be equal to $C_{d2}$. As such, voltage $V_{d1}$ is substantially equal to voltage $V_{d2}$. Further, the winding in N1 is preferably selected to be equal to the winding in N2. In this case, the winding voltage and polarity across the primary windings N1 and N2 are substantially equal.

Operation of the embodiment of FIG. 4 is explained hereunder in conjunction with FIGS. 5a–e which illustrate certain of the waveforms present in circuit 10. During the time when switch S is on (t1–t3) (see FIG. 5a), voltage $V_{d1}$, on bus capacitor $C_{d1}$, discharges through a circuit path defined by voltage source $V_{d1}$, leakage inductor $L_{k1}$, primary winding N1, switch S and back to ground. In this first circuit path, a voltage is developed across primary winding N1. This voltage is coupled to the load circuit 60, as will be described below. Also, during this time, i.e., (t1–t3), voltage $V_{d2}$ on bus capacitor $C_{d2}$ discharges through a path defined by voltage source $V_{d2}$, switch S, primary winding N2, and leakage inductor $L_{k2}$ In this second circuit path, a voltage is developed across primary winding N2.

"The voltage developed across primary winding N1 in the first circuit path is magnetically coupled to the secondary winding N3 of transformer T. A voltage difference between the magnetically coupled voltage across secondary winding N3, i.e., and the output voltage, $V_o$, across the load $R_b$, is applied as an additional voltage $V_{lf}$ across inductor $L_f$, which is delivered as additional power to the load $R_b$."

Figure 5:
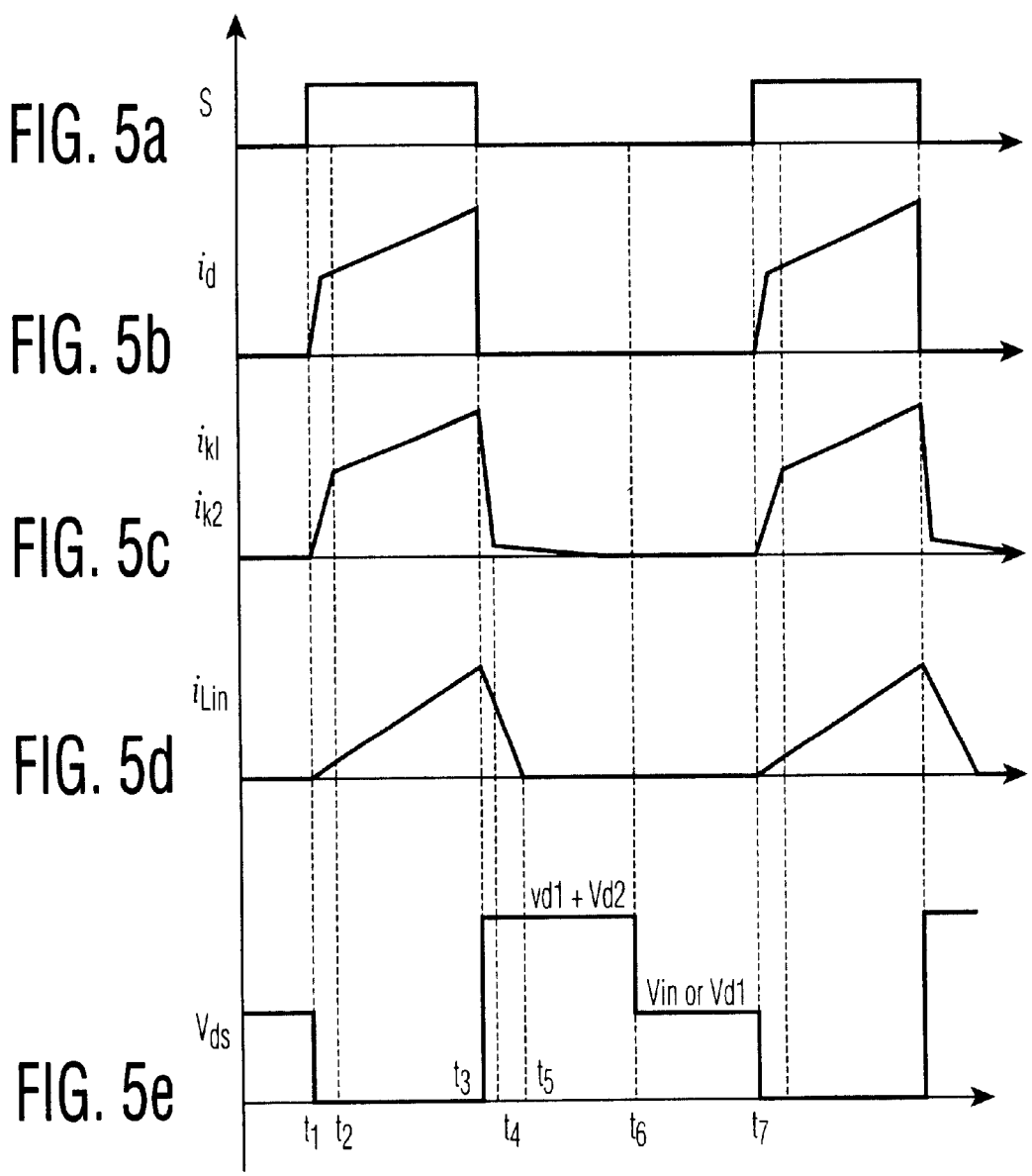
FIGS. 5a–5e illustrate representative waveforms present in the circuit of FIG. 4.

From the point at which switch S turns off at time instant t3, the leakage energy stored in leakage inductors $L_{k1}$, and $L_{k2}$ during the time (t1–t2), is transferred to the respective DC bus capacitors $C_{d2}$ and $C_{d1}$. The transfer of leakage energy is represented by leakage (i.e., magnetizing) currents $I_{k1}$ and $I_{k2}$, as shown in FIG. 5b. Referring to FIG. 4, leakage current $I_{k1}$ flows from $L_{k1}$, through Ni to charge bus capacitor $C_{d2}$ and leakage current $I_{k2}$ flows from $L_{k2}$ through diode D to charge bus capacitor $C_{d1}$. Also, at the point at which switch S turns off at time instant t3, the transformer is being reset. That is, voltage $V_{d1}$ is applied across winding N2 and voltage $V_{d2}$ is applied across winding N1. Also, the boost inductor current $I_{lin}$, charges the two DC bus capacitors $C_{d1}$, and $C_{d2}$ until time instant t5, when it decreases to zero (See FIG. 5d).

As shown in FIG. 5e, at time instant t3, the voltage across switch S, i.e., $V_{ds}$, is clamped to a value equal to the sum of voltages $V_{d1}$ and $V_{d2}$ across capacitors $C_{d1}$ and $C_{d2}$, respectively. The clamped voltage across switch S remains in effect until the magnetizing current decreases to zero at time instant t6 (See FIG. 5c). After the transformer T is reset, diode D becomes nonconducting, and the voltage across the power switch S is the maximum value of $V_{d1}$ and $V_{in}$ until time instant t7, when the power switch turns on again.

It should be appreciated that voltage spikes are eliminated or substantially reduced across switch S as a consequence of the voltage across switch $S,V_{ds}$, being clamped to the sum of $(V_{d1}+V_{d2})$ at turn off.

For the single power stage converter with PFC function, as illustrated in FIG. 4, a general drawback exists concerning the power balance between the input and the output power. Because only one active power switch is used in the single stage converter, the switch will only have two control quantities, that is, duty-cycle and switching frequency. One way to balance the input and output power and to fix the DC bus voltage is by controlling the output power with via the duty-cycle and controlling the input power with the switching frequency.

Figure 6:
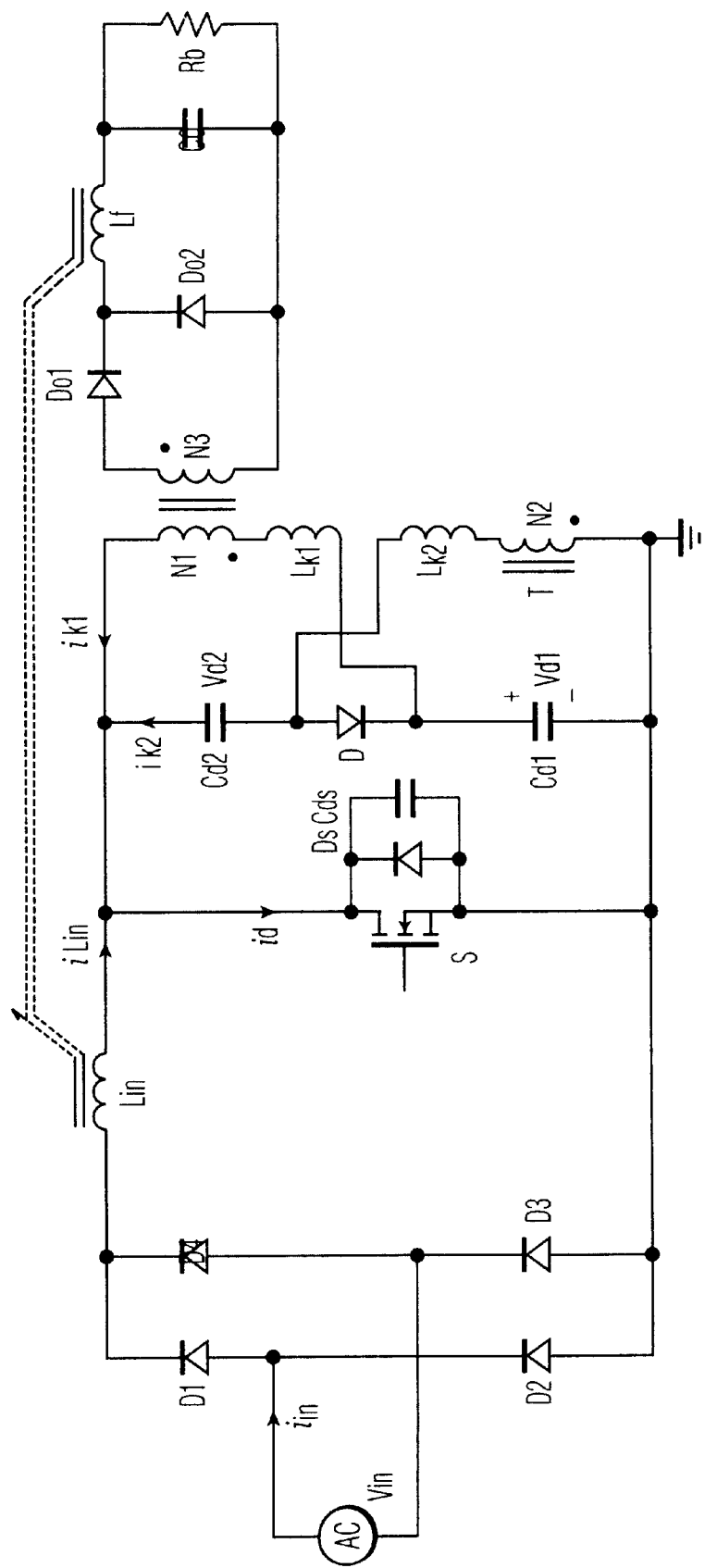
FIG. 6 is a circuit diagram illustrating an LCD backlighting inverter circuit in accordance with a second embodiment of the present invention.

A second solution for balancing input and output power is to insert an indirect control quantity. FIG. 6 illustrates a circuit which utilizes such a solution. In FIG. 6, circuit components corresponding to the components of FIG. 4 are denoted by the same symbols. The configuration shown in FIG. 6 differs from that of FIG. 4 only in that the input inductor $L_{in}$, and forward filter inductor $L_f$ can be a loose coupling. In this manner, the DC bus voltage will reflect into the output loop to regulate the output power indirectly. One benefit of this approach is that a portion of the input power will be directly delivered to the output thereby helping to increase the efficiency of the converter.

Figure 7:
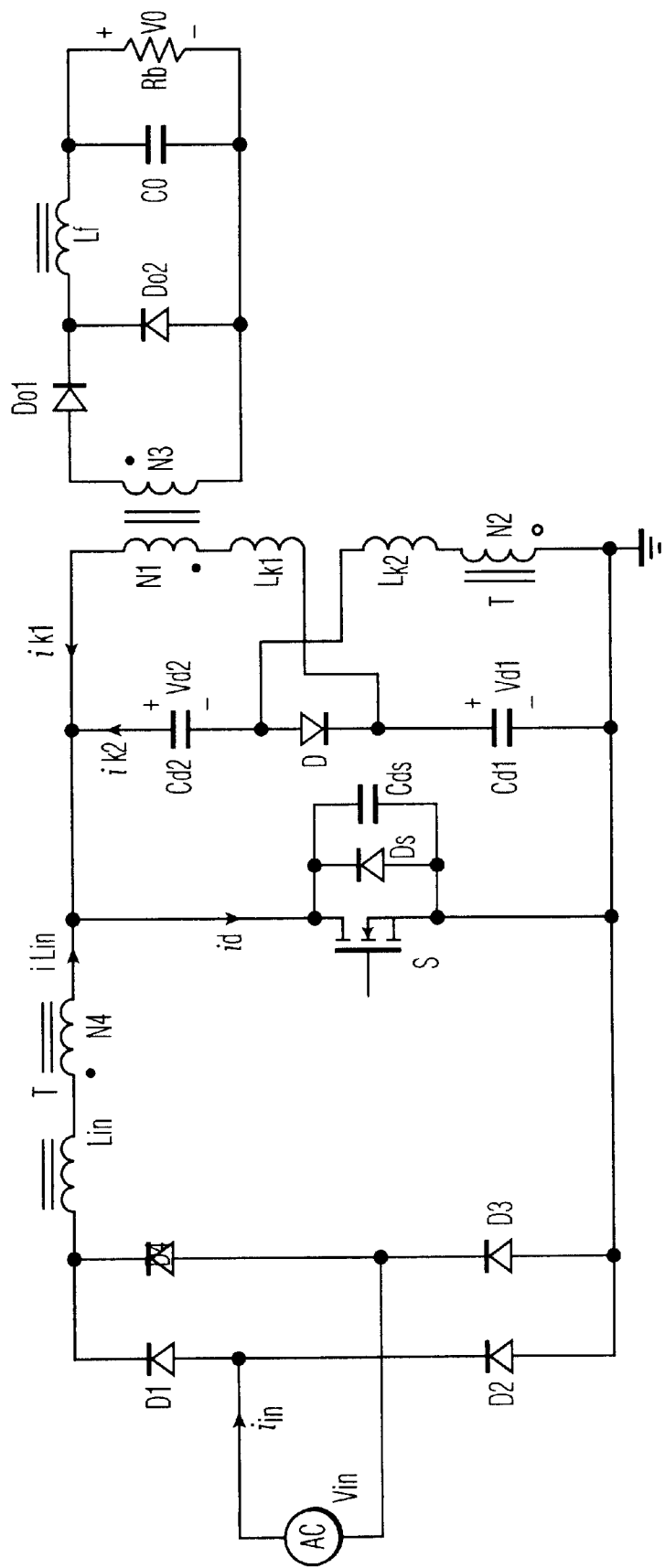
FIG. 7 is a circuit diagram illustrating an LCD backlighting inverter circuit in accordance with a third embodiment of the present invention."

In FIG. 6, circuit components corresponding to the components of FIG. 4 and FIG. 6 are denoted by the same symbols. The configuration shown in FIG. 7 differs from that of FIGS. 4 and 6 only in that an extra winding N4 is used which can directly transfer energy to the output without processing by the switch. As a result, conversion efficiency is further improved.

While the invention has been illustrated with respect to several specific embodiments thereof, these embodiments should be considered as illustrative rather than limiting. Various modifications and additions may be made and will be apparent to those skilled in the art.

What is claimed is:

1. A forward converter comprising:
   a rectifier circuit for rectifying an AC input voltage and thereby providing an unregulated DC voltage;
   an input inductor connected to said rectifier circuit to receive the unregulated DC voltage and provide a filtered unregulated DC input voltage;
   a switching element connected to said inductor, and adapted to be switched on and off in response to a switching control signal;
   an isolation transformer having a first primary winding and a second primary winding for receiving said filtered unregulated DC voltage through said first and second primary winding when said switching element is switched off and for inducing said filtered unregulated DC voltage to a secondary winding when said switching element is switched on, said first and second primary windings accumulate said filtered unregulated DC voltage which is induced to said secondary winding when said switching element is switched on;
   a first DC bus capacitor connected to the inductor, said first DC bus capacitor further connected to said switching element and adapted to recover energy from said isolation transformer, said first DC bus capacitor further adapted to limit the voltage on said switching element; and
   a diode connected to said first DC bus capacitor; and
   a second DC bus capacitor connected to said diode, and adapted to recover energy from said isolation transformer, said second DC bus capacitor further adapted to limit the voltage on said switching element.

2. The forward converter of claim 1, wherein said rectifier circuit comprises a diode bridge rectifier.

3. The forward converter of claim 1, wherein said switching element is a MOSFET device.

4. The forward converter of claim 1, further including a load side connected through said isolation transformer wherein said load side includes a secondary winding of said isolation transformer connected in series with a first load diode and a forward filter inductor, said first load diode disposed electrically parallel to a second load diode, said load inductor disposed electrically parallel to a load capacitor and the second load diode.

5. The forward converter of claim 1, wherein said input inductor and forward filter inductor are coupled to reflect a direct current (DC) bus voltage into the load side.

6. The forward converter of claim 1, wherein said isolation transformer further includes a third primary winding which is directly coupled to the load side to reflect a DC bus voltage.

7. The forward converter of claim 1, wherein the voltage across said switching element is clamped to a value substantially equal to the sum of the voltages across said first and second DC bus capacitors.

8. The forward converter of claim 1, wherein a voltage on said first DC bus capacitor is applied to said first primary winding of said transformer during a time when said switching element is switched on, and a voltage on said second DC bus capacitor is applied to said second primary winding of said transformer during a time when said switching element is switched on.

9. A forward converter, comprising
   a switching element adapted to be switched between an ON state and an OFF state;
   an isolation transformer operating in accordance with a switching of said switching element between the ON state and the OFF state
   a diode;
   a first DC bus capacitor connected to said diode; and
   a second DC bus capacitor connected to said diode, wherein said first DC bus capacitor and said second DC bus capacitor are adapted to recover energy from said isolation transformer and to limit the voltage on said switching element when said switching element is switched to the OFF state.

10. The forward converter of claim 9, further comprising:
   a first inductor connected to said isolation transformer and said first DC bus capacitor; and a second inductor connected to said isolation transformer and said second DC bus capacitor.

11. A method of clamping a voltage across a switching element in a forward converter, said method comprising:

providing a voltage clamping structure in parallel with the switching element, the clamping structure including a first DC bus capacitor connected to a diode and a second DC bus capacitor connected to the diode; and clamping the voltage across the switching element to a value less than or equal to the sum of the voltages across the first DC bus capacitor and the second DC bus capacitor during an OFF state of the switching element.

12. A method of transferring energy in a forward converter, said method comprising:

providing an energy storage structure in parallel with a switching element, the clamping structure including a first DC bus capacitor connected to a diode and a second DC bus capacitor connected to the diode; and recovering energy in said first DC bus capacitor and said second DC bus capacitor during an OFF state of the switching element.

* * * * *